United States Patent
Chen

(10) Patent No.: US 7,064,354 B2
(45) Date of Patent: Jun. 20, 2006

(54) COLOR MIXING LIGHT EMITTING DIODE

(75) Inventor: Shi-Ming Chen, Tainan (TW)

(73) Assignee: Epitech Technology Corporation, Tainan (TW)

( * ) Notice: Subject to any disclaimer, the term of this patent is extended or adjusted under 35 U.S.C. 154(b) by 37 days.

(21) Appl. No.: 10/408,614

(22) Filed: Apr. 7, 2003

(65) Prior Publication Data

US 2004/0129944 A1    Jul. 8, 2004

(30) Foreign Application Priority Data

Jan. 2, 2003    (TW) ............................... 92100066 A
Feb. 17, 2003    (TW) ............................... 92103249 A

(51) Int. Cl.
*H01L 27/15*    (2006.01)
*H01L 31/12*    (2006.01)

(52) U.S. Cl. ............................. 257/89; 257/88; 257/90; 257/78; 257/77; 257/79

(58) Field of Classification Search ................ 257/89, 257/79, 82, 85, 90, 94, 96, 97, 93, 99, 100
See application file for complete search history.

(56) References Cited

U.S. PATENT DOCUMENTS

| | | | |
|---|---|---|---|
| 3,875,473 A | | 4/1975 | Lebailly |
| 4,675,575 A | * | 6/1987 | Smith et al. ............. 315/185 S |
| 5,537,229 A | * | 7/1996 | Brandestini et al. ........ 358/509 |
| 5,808,592 A | | 9/1998 | Mizutani et al. |
| 5,949,528 A | * | 9/1999 | Iwasaki ....................... 355/402 |
| 5,963,185 A | * | 10/1999 | Havel ........................... 345/83 |
| 5,998,925 A | | 12/1999 | Shimizu et al. |
| 6,069,440 A | | 5/2000 | Shimizu et al. |
| 6,540,377 B1 | * | 4/2003 | Ota et al. .................... 362/231 |
| 6,563,139 B1 | * | 5/2003 | Hen ............................. 257/89 |
| 6,642,545 B1 | * | 11/2003 | Okazaki ....................... 257/89 |
| 2001/0032985 A1 | * | 10/2001 | Bhat et al. .................... 257/88 |
| 2002/0001192 A1 | * | 1/2002 | Suehiro et al. ............. 362/240 |
| 2002/0113246 A1 | * | 8/2002 | Nagai et al. .................. 257/99 |
| 2002/0139987 A1 | | 10/2002 | Collins, III et al. |
| 2002/0167015 A1 | * | 11/2002 | Okazaki ....................... 257/79 |
| 2003/0047742 A1 | | 3/2003 | Hen |
| 2003/0067775 A1 | * | 4/2003 | Nagai et al. ................. 362/240 |
| 2003/0146445 A1 | * | 8/2003 | Hen ............................. 257/93 |

FOREIGN PATENT DOCUMENTS

| | | |
|---|---|---|
| DE | 3842394 | 6/1990 |
| EP | 0 855 751 A2 | 7/1998 |
| EP | 1 126 526 A2 | 8/2001 |

(Continued)

*Primary Examiner*—Nathan J. Flynn
*Assistant Examiner*—Fazli Erdem
(74) *Attorney, Agent, or Firm*—The Webb Law Firm

(57) ABSTRACT

A color mixing light emitting diode (LED) is disclosed. The present invention is featured in that a plurality of LEDs emitting different colors of light can be electrically connected in series and/or in parallel by using chip manufacturing to generate other colors of light. For example, the first LED chip set can emit such as yellow light (or changing to reddish-red light), and the second LED chip can emit such as blue light (or changing to bluish-green light), thereby making the present invention to emit white light. Moreover, the first LED chip set can be a photoluminescence LED chip, wherein the first LED chip can be excited by the light emitted by the second LED chip to emit light, and then the light emitted by the second LED chip and the light emitted by the first LED chip can be mixed into other colors of light.

6 Claims, 16 Drawing Sheets

FOREIGN PATENT DOCUMENTS

| | | |
|---|---|---|
| EP | 1 275 300 A1 | 1/2003 |
| GB | 1 485 462 | 9/1977 |
| JP | 11-274558 | 10/1999 |
| WO | WO 00/65665 | 11/2000 |
| WO | WO 00/76005 A1 | 12/2000 |

\* cited by examiner

490nm — 14mil × 14mil
610nm — 20mil × 20mil

490nm − 40mil × 40mil
610nm − 40mil × 80mil

COLOR MIXING LIGHT EMITTING DIODE

FIELD OF THE INVENTION

The present invention relates to a structure of a light emitting diode (LED), and more particularly, to a structure of a color mixing LED, wherein a plurality of LEDs emitting different colors of light can be electrically connected in series and/or in parallel by using chip manufacturing to generate other colors of light.

BACKGROUND OF THE INVENTION

The persons skilled in the art about the structure of color mixing LED and the method of making the same ever submitted several relevant documents. For example, Nichia Chemical Industries, Ltd. submitted that the fluorescent powder could be utilized (U.S. Pat. Nos. 5,998,925/6,069,440), wherein the blue light LED can be used to excite yttrium-aluminum-garnet (YAG) fluorescent body to generate yellow light that can be mixed with the original blue light into white light. In this method, the YAG fluorescent material is coated on the InGaN blue light chip having a wavelength of 460 nm; then the blue light LED is used to illuminate the fluorescent material to generate yellow light that has a wavelength of 555 nm and is complementary to blue light; and then the principle of lens is applied to mix the complementary yellow light and blue light to obtain the output of white light. Even though this method has the advantage of low cost, yet the light-emitting efficiency is worse (due to the low opto transformation efficiency of YAG fluorescent material), so that the output of high power cannot be obtained. Moreover, the temperature and the operating current easily cause the change of wavelength of blue light LED, hence the light-emitting efficiency of YAG becomes worse (the opto transformation efficiency of YAG fluorescent material changes as the wavelength of blue light LED changes); and it is very difficult to achieve output of white light having high output intensity and under steady operation.

Besides, ORSAM Opto Semiconductors submitted that three LEDs emitting three basic colors—red, green, and blue of light respectively could be packaged together to generate white light. In such a method, it is necessary to adjust the wavelength and brightness of the three LEDs respectively in order to obtain purer white color; hence the light-emitting color cannot be controlled easily. Moreover, perhaps the colors will be mixed non-uniformly due to the three independent light sources. Furthermore, since the semiconductor materials of the LEDs emitting three basic colors—red, green, and blue of light respectively are quite different from each other, therefore the design of the driving circuit becomes rather complicated and hence the manufacturing cost is higher.

SUMMARY OF THE INVENTION

The significant discovery in the present invention is that the luminous output of LED can be changed by changing chip size and electrode shape; hence an objective of the present invention is to provide a color mixing LED, wherein a plurality of LEDs having different wavelengths are electrically connected in series or in parallel by using chip manufacturing (such as flip chip), wherein the epitaxy structure is changed to generate very large range of light-emitting wavelengths; and the shape of electrode pads and the size of chip of the plurality of LEDs are changed to generate different current spreading and different luminous output ratio, thereby creating the luminance output of high power having very large range of light-emitting wavelengths and extensive and stable range of color temperature.

Another objective of the present invention is to provide a color mixing LED, wherein the constant current or constant voltage is used to generate stable output, so that the light-emitting wavelength will not change easily as the temperature and the operating current change.

Still another objective of the present invention is to provide a color mixing LED, wherein each module can be used in the current application products of 12 V or 24 V easily, since its operating voltage is such as 6 V (with blue light of 3–4 V and yellow light of 2–2.5 V).

Further another objective of the present invention is to provide a color mixing LED, wherein the operating voltage of each module can be in the range of 3~4V (such as by using chip manufacturing or by connecting reddish-orange light LED set and bluish-green light LED in parallel).

Further still another objective of the present invention is to provide a color mixing LED, wherein the brightness of each LED can be controlled by modulating the size of the relative area of each LED, thereby achieving the purpose of easily controlling output wavelength after color mixing.

Even still another objective of the present invention is to provide a color mixing LED, wherein the mixed light that is emitted by a plurality of adhered LEDs is symmetrical.

According to the aforementioned objectives of the present invention, the present invention provides a color mixing LED, comprising: a first electrode having a first polarity; a first LED chip located on the first electrode; a second LED chip located on one portion of the first LED chip; a second electrode having a second polarity, wherein the second electrode is located on the other portion of the first LED chip; a third electrode having the first polarity, wherein the third electrode is located on one portion of the second LED chip; and a fourth electrode having the second polarity, wherein the fourth electrode is located on the other portion of the second LED chip. Moreover, the aforementioned first LED chip can emit such as reddish-orange light or changing to yellow light; and the aforementioned second LED chip can emit such as bluish-green light or changing to blue light.

According to the aforementioned objectives of the present invention, the present invention provides another color mixing LED, comprising: a first LED chip; a transparent adhesive layer located on a first portion of the first LED chip; a first electrode having a first polarity, wherein the first electrode is located on a second portion of the first LED chip; a second electrode having a second polarity, wherein the second electrode is located on a third portion of the first LED chip; and a second LED chip located on the transparent adhesive layer, wherein a third electrode having the first polarity is located on a portion of a lower surface of the second LED chip, and the third electrode contacts the second electrode. Moreover, the aforementioned first LED chip can emit such as yellow light or reddish-orange light; and the aforementioned second LED chip can emit such as blue light or bluish-green light.

According to the aforementioned objectives of the present invention, the present invention provides still another color mixing LED, comprising: a first LED chip; a transparent adhesive layer located on the first LED chip; a second LED chip located on the transparent adhesive layer; an electrode of a first polarity, wherein the electrode of the first polarity is located on one portion of the second LED chip; and an electrode of a second polarity, wherein the electrode of the second polarity is located on the other portion of the second LED chip. Moreover, the first LED chip is a photoluminescence LED chip and comprises at least one multi quantum well structure.

According to the aforementioned objectives of the present invention, the present invention provides further another color mixing LED, comprising: a first electrode having a first polarity; a first LED chip located on the first electrode; a second electrode having a second polarity, wherein the second electrode is located on one portion of the first LED chip; a third electrode having the first polarity, wherein the third electrode is located on the second electrode and contacts the second electrode; a transparent adhesive layer located on the other portion of the first LED chip, wherein the transparent adhesive layer has about the same height as the third electrode; a second LED chip located on the transparent adhesive layer and the third electrode; and a fourth electrode having the second polarity, wherein the fourth electrode is located on the second LED chip. Moreover, the aforementioned first LED chip can emit such as yellow light (584 nm) or reddish-orange light (610 nm); and the aforementioned second LED chip can emit such as blue light (480 nm) or bluish-green light (495 nm).

According to the aforementioned objectives of the present invention, the present invention provides another color mixing LED, comprising: a first electrode having a first polarity; a first LED chip located on the first electrode; a second electrode having a second polarity, wherein the second electrode having the second polarity is located on one portion of the first LED chip; a third electrode having the second polarity, wherein the third electrode having the second polarity is located on the second electrode having the second polarity; an insulating layer located on the other portion of the first LED chip; a fourth electrode having the first polarity, wherein the fourth electrode having the first polarity is located on the insulating layer; a second LED chip located on the third electrode having the second polarity and the fourth electrode having the first polarity; and a substrate located on the second LED chip. Moreover, the aforementioned first LED chip can emit such as yellow light or changing to reddish-orange light; and the aforementioned second LED chip can emit such as blue light or changing to bluish-green light.

According to the aforementioned objectives of the present invention, the present invention provides still another color mixing LED, comprising: a first electrode having a first polarity; a first LED chip located on the first electrode; a second electrode having a second polarity, wherein the second electrode having the second polarity is located on the first LED chip; a third electrode having the second polarity, wherein the third electrode having the second polarity is located on the second electrode having the second polarity; an electrically conductive substrate located on the third electrode having the second polarity; a second LED chip located on the electrically conductive substrate; and a fourth electrode having the first polarity; wherein the fourth electrode having the first polarity is located on the second LED chip. Moreover, the aforementioned first LED chip can emit such as yellow light or changing to reddish-orange light; and the aforementioned second LED chip can emit such as blue light or changing to bluish-green light.

According to the aforementioned objectives of the present invention, the present invention provides further another color mixing LED, comprising: a first LED chip; a second LED chip that is electrically connected to the first LED chip in series; and a third LED chip that is electrically connected to the second LED chip in series, wherein the first LED chip, the second LED chip, and the third LED chip can emit red, green, or blue light.

According to the aforementioned objectives of the present invention, the present invention provides still further another color mixing LED, comprising: a first LED chip having a first electrode and a second electrode, wherein the first electrode has a first polarity, and the second electrode has a second polarity; a second LED chip having a third electrode and a fourth electrode, wherein the third electrode has the first polarity, the fourth electrode has the second polarity, and the third electrode is electrically connected to the second electrode; and a third LED chip having a fifth electrode and a sixth electrode, wherein the fifth electrode has the first polarity, the sixth electrode has the second polarity, the fifth electrode is electrically connected to the first electrode, and the sixth electrode is electrically connected to the fourth electrode. Moreover, the aforementioned first LED chip and the second LED chip can emit reddish-orange light or changing to yellow light; and the third LED chip can emit bluish-green light or changing to blue light.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
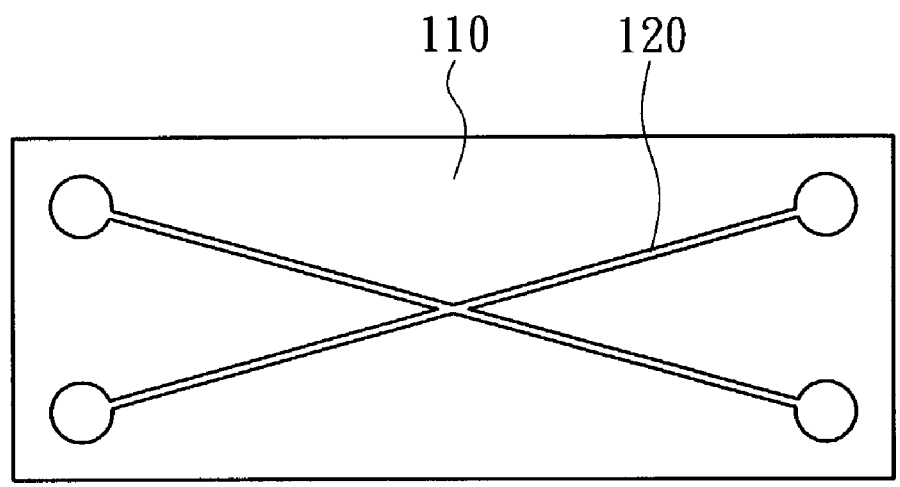
FIG. 1A is a diagram showing the top view of the yellow light LED of the color mixing LED according to an embodiment of the present invention.
Figure 1B:
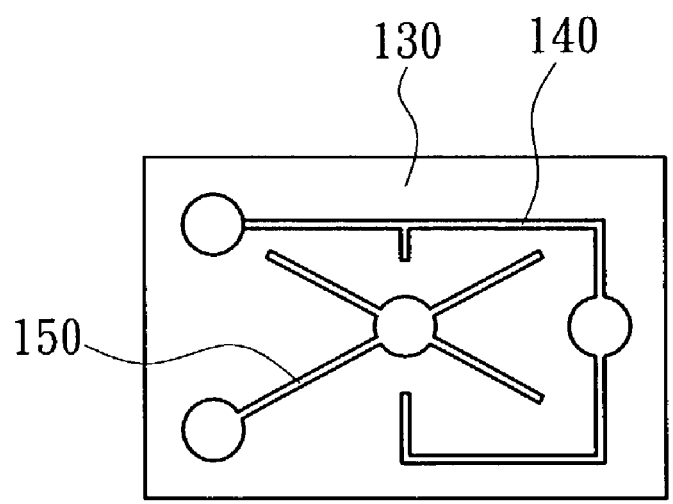
FIG. 1B is a diagram showing the top view of the blue light LED of the color mixing LED according to an embodiment of the present invention.
Figure 2A:
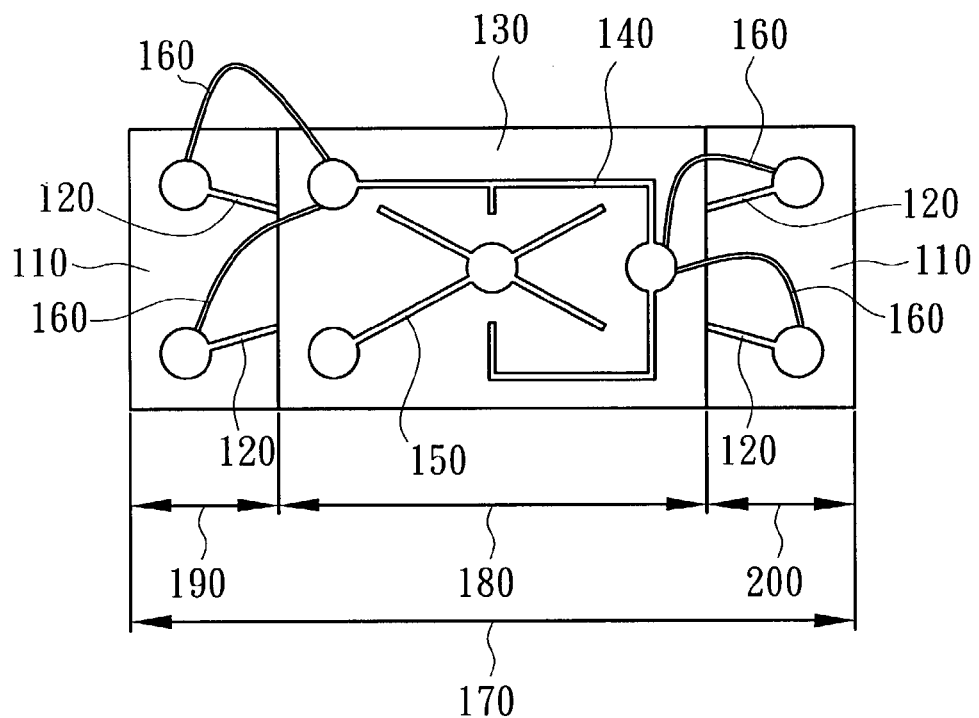
FIG. 2A is a diagram showing the top view of the color mixing LED according to an embodiment of the present invention.

The present invention relates to a structure of a color mixing LED, wherein a plurality of LEDs emitting different colors of light can be electrically connected in series and/or in parallel by using chip manufacturing to generate other colors of light. Please refer to FIG. 1A and FIG. 1B showing respectively the top views of the yellow light LED and the blue light LED of the color mixing LED according to an embodiment of the present invention. In FIG. 1A, a yellow light LED 110 thereon comprises a positive electrode 120; and in FIG. 1B, a blue light LED 130 thereon comprises a negative electrode 140 and the positive electrode 150. Please refer to FIG. 2A showing the top view of the color mixing LED according to an embodiment of the present invention. The color mixing LED shown in FIG. 2A is fabricated by adhering the blue light LED 130 shown in FIG. 1B to the yellow light LED 110 shown in FIG. 1A with transparent glue (not shown). Moreover, the positive electrode 120 on the yellow light LED 110 and the negative electrode 140 on the blue light LED 130 are electrically connected via the connective wire 160 to form a single circuit in series. Furthermore, the transparent glue used can be of high transparency, high-temperature resistance, and excellent heat conductivity so as to be used under high-power operating conditions. In addition, the material of the blue light LED 130 can belong to such as BAlGaInNPAs series; and the material of the yellow light LED 110 can belong to such as AlGaInPAs series. Besides, the negative electrode (which is not shown in FIG. 1A and FIG. 2A, but shown in FIG. 2B) of the yellow light LED 110 is located on the lower surface of the chip. The mixed light emitted by the adhered color mixing LED has advantages of symmetry and one single power operating.

Figure 2B:
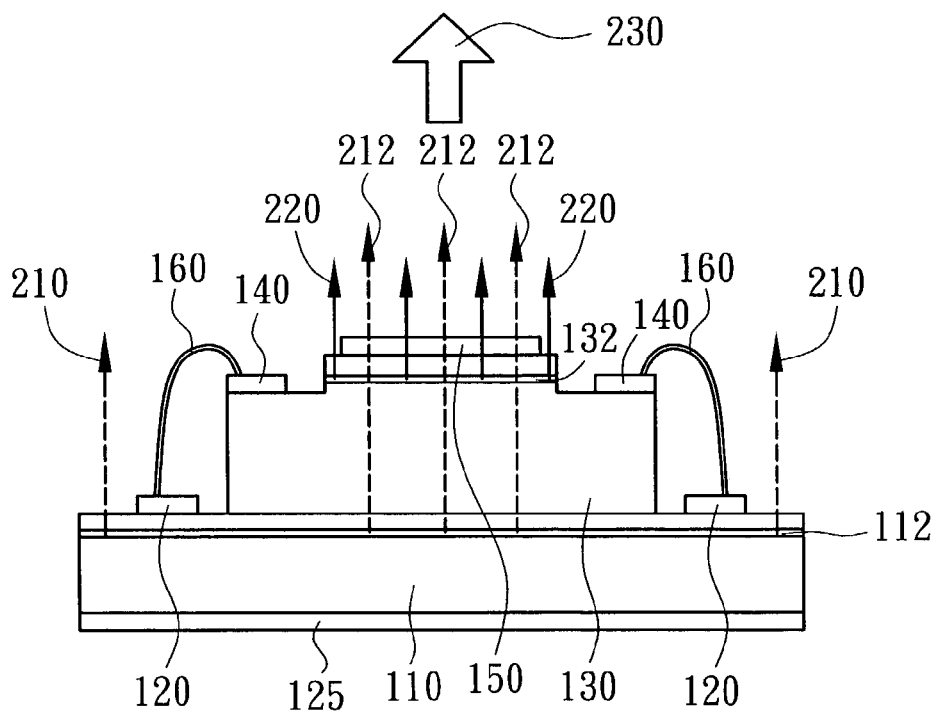
FIG. 2B is a diagram showing the front view of the color mixing LED according to an embodiment of the present invention.
Figure 3A:
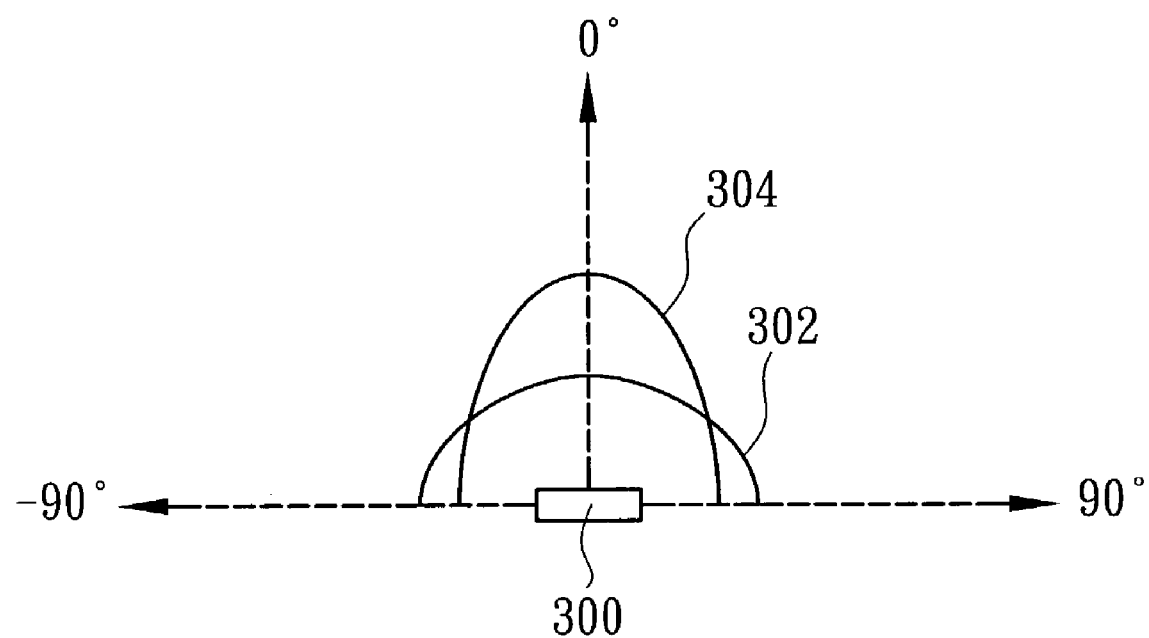
FIG. 3A is a diagram showing the light-emitting region of the color mixing LED according to an embodiment of the present invention.

Please refer to FIG. 2B showing the front view of the color mixing LED according to an embodiment of the present invention. The lowest layer of the color mixing LED shown in FIG. 2B is a negative electrode 125 that is the negative electrode of the yellow light LED 110 (having the light emitting layer 112), wherein the yellow light LED 110 is located on the negative electrode 125. The blue light LED 130 (having the light emitting layer 132) is located on one portion of the yellow light LED 110; and the positive electrode 120 of the yellow light LED 110 is located on the other portion of the yellow light LED 110. Besides, the negative electrode 140 of the blue light LED 130 is located on one portion of the blue light LED 130; and the positive electrode 150 of the blue light LED 130 is located on the other portion of the blue light LED 130. In addition, just as described above, the positive electrode 120 on the yellow light LED 110 and the negative electrode 140 on the blue light LED 130 are electrically connected via the connective wire 160 to form a single circuit in series. Consequently, the light emitted by the yellow light LED 110 can be divided into two parts: one part is the pure yellow light 210; the other part is the yellow light passing through blue light LED 212, since the energy gap of the blue light LED 130 is wider than that of the yellow light LED 110. Therefore, the yellow light passing through blue light LED 212 can be mixed with the blue light 220 emitted by the blue light LED 130 into the white light 230. Furthermore, the light emitting region of the color mixing LED according to the aforementioned embodiment of the present invention is shown in FIG. 3A, wherein the yellow light region 302 and the blue light region 304 are shown to indicate that the mixed light of the light emitted by the adhered yellow light LED 110 and blue light LED 130 respectively has symmetry.

Figure 3B:
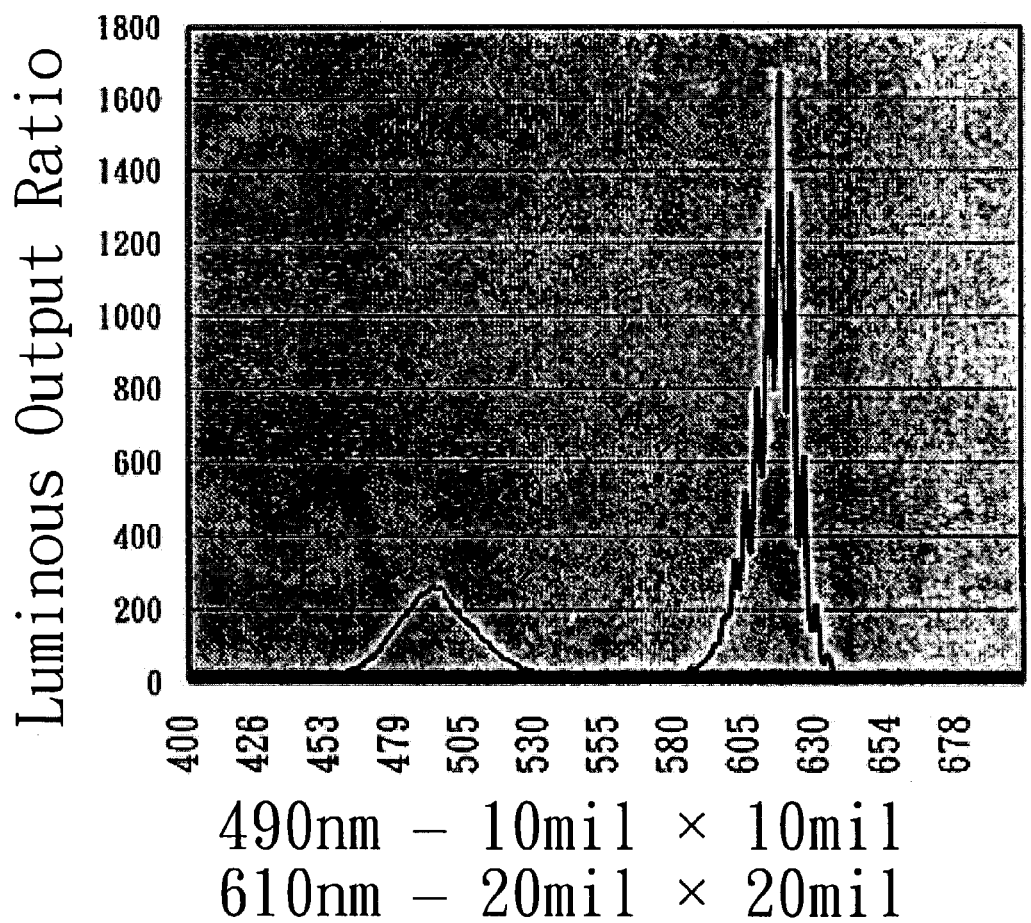
FIGS. 3B~3D are diagrams showing about the curves regarding various luminous output ratios generated by reddish-orange and bluish-green light chips having various sizes.
Figure 3C:
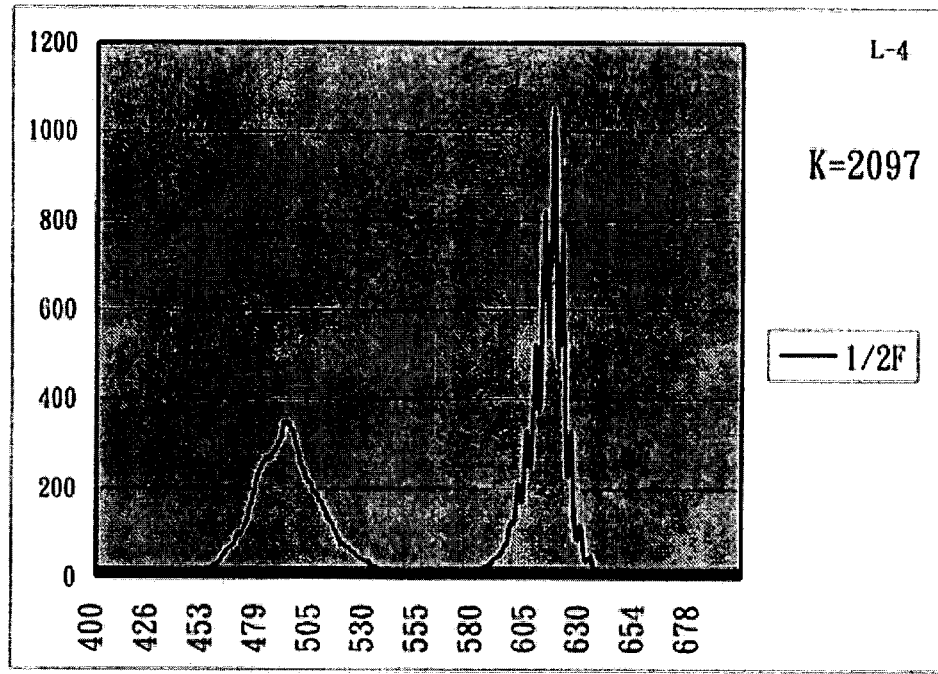
Figure 3D:
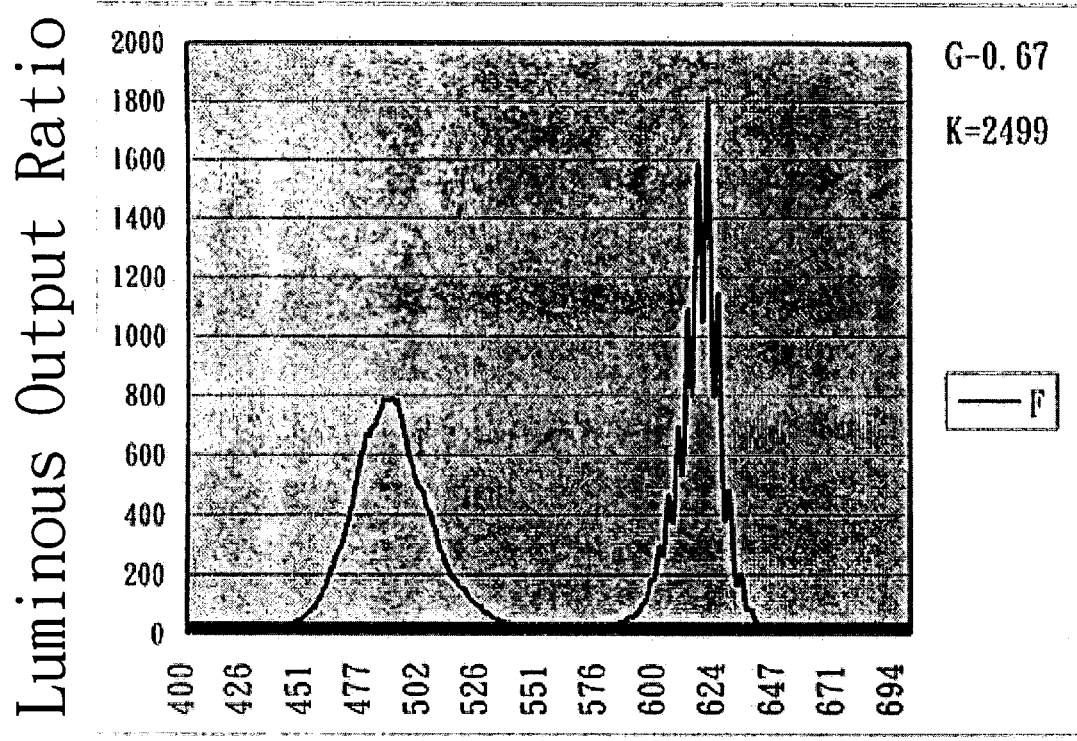

In the aforementioned embodiment as shown in FIG. 2A and FIG. 2B, the blue light LED 130 of 480 nm in wavelength and the yellow light LED 110 of 584 nm in wavelength can be used. After etching and metal evaporation processes, the blue light LED 130 is cut into one having the size of 40 mil×40 mil or changing to 10 mil×10 mil; the yellow light LED 110 is cut into one having the size of 40 mil×80 mil or changing to 16 mil×16 mil; and then the transparent glue of high heat-conductivity is used to adhere the blue light LED 130 to the yellow light LED 110. That is, in FIG. 2A, the width 180 is 40 mil; the width 170 is 80 mil; and both of the width 190 and the width 200 are 20 mil. When the adhesion is achieved, the wire-bonding machine is used to electrically connect the negative electrode 140 of the blue light LED 130 to the positive electrode 120 of the yellow light LED 110 via the connective wire 160, thereby forming a circuit module in series. The power is supplied to the positive electrode 150 of the blue light LED 130 and the negative electrode 125 of the yellow light LED 110 to form a module of 6 V or 12 V that can be used conveniently in circuit. Furthermore, the width 180 of the blue light LED 130 (may be changed to bluish-green light of 495 nm in wavelength) can be changed; or the width 190 or the width 200 of the yellow light LED 110 (may be changed to reddish-orange light of 610 nm in wavelength) can be changed, thereby adjusting the output intensity. Afterwards, according to demands, the relative chip sizes can be adjusted to generate different luminous output ratios and wavelength outputs. Generally speaking, the lengths and widths of the upper and lower chips can be 7 mil~200 mil. The sizes of the upper and lower chips will be dependent on the output power of both the chips, the modulated wavelength, and the color temperature of output. FIGS. 3B~3D are diagrams showing about various luminous output ratios generated by reddish-orange and bluish-green light chips having various sizes, thereby generating color mixing lights having various color temperatures.

In the aforementioned embodiment as shown in FIG. 2A and FIG. 2B, the blue light LED 130 of 480 nm in wavelength and the yellow light LED 110 of 584 nm in wavelength can be also used. When the process of the blue light LED 130 is completed, it can be adhered on the yellow light LED 110 and then the subsequent processes such as cutting can proceed. The electrodes shown in FIG. 2B can be replaced simultaneously with those having opposite polarity but still within the scope of the claims of the present invention.

Figure 4:
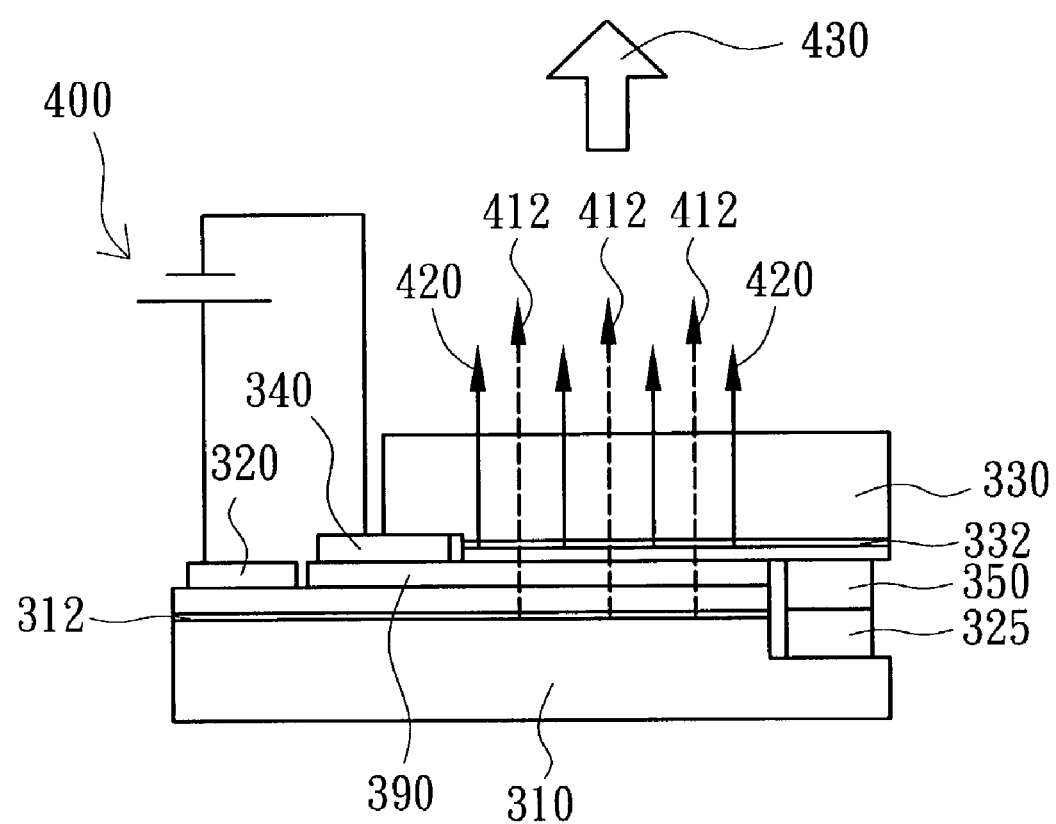
FIG. 4 is a diagram showing the front view of the color mixing LED according to another embodiment of the present invention.

Please refer to FIG. 4 showing the front view of the color mixing LED according to another embodiment of the present invention. The lowest layer shown in FIG. 4 is a BAlGaInNPAs reddish-orange light LED 310 (having a light emitting layer 312). A transparent adhesive layer 390 (such as SiO$_2$) is located on the first portion of the BAlGaInNPAs reddish-orange light LED 310; a positive electrode 320 of the BAlGaInNPAs reddish-orange light LED 310 is located on the second portion of the first portion of the BAlGaInNPAs reddish-orange light LED 310; and a negative electrode 325 of the BAlGaInNPAs reddish-orange light LED 310 is located on the third portion of the BAlGaInNPAs reddish-orange light LED 310. Besides, a BAlGaInNPAs bluish-green light LED 330 (having the light emitting layer 332) is located on a transparent adhesive layer 390, wherein one portion of the lower surface of a BAlGaInNPAs bluish-green light LED 330 thereon comprises a positive electrode 350; and the positive electrode 350 contacts the negative electrode 325 of the BAlGaInNPAs reddish-orange light LED 310. Moreover, a negative electrode 340 of the BAlGaInNPAs bluish-green light LED 330 is located on the transparent adhesive layer 390. Therefore, the light emitted by the BAlGaInNPAs reddish-orange light LED 310 can be divided into two parts: one part is the pure reddish-orange light (not shown); the other part is the reddish-orange light passing through a bluish-green light LED 412. Consequently, the reddish-orange light passing through the bluish-green light LED 412 can be mixed with the bluish-green light 420 emitted by the BAlGaInNPAs bluish-green light LED 330 into the white light 430. Furthermore, the aforementioned BAlGaInNPAs reddish-orange light LED 310 can be replaced with the LED chip of other types that can emit yellow light; and the aforementioned BAlGaInNPAs bluish-green light LED 330 can be replaced with the LED chip of other types that can emit blue light, thereby also making the color mixing LED of the present invention to emit white light.

In the aforementioned embodiment as shown in FIG. 4, the BAlGaInNPAs bluish-green light LED 330 of about 495 nm in wavelength and the BAlGaInNPAs reddish-orange light LED 310 of about 610 nm in wavelength can be used. After etching and metal evaporation processes, the BAlGaInNPAs bluish-green light LED 330 is cut into one having the size of 40 mil×40 mil; and the BAlGaInNPAs reddish-orange light LED 310 is cut into one having the size of 40 mil×80 mil. Afterwards, the electrically conductive metal material of high heat-conductivity (not shown) is used to flip-chip adhere the negative electrode 325 of the BAlGaInNPAs reddish-orange light LED 310 and the positive electrode 350 of the BAlGaInNPAs bluish-green light LED 330. The power 400 is supplied to the negative electrode 340 of the BAlGaInNPAs bluish-green light LED 330 and the positive electrode 320 of the BAlGaInNPAs reddish-orange light LED 310 form a module of 6 V or 12 V that can be used conveniently in circuit. Furthermore, the width of the BAlGaInNPAs bluish-green light LED 330 (may be changed to blue light) can be changed; or the width of the BAlGaInNPAs reddish-orange light LED 310 (may be changed to yellow light) can be changed, thereby adjusting the output intensity. Afterwards, according to demands, the relative chip sizes can be adjusted to change the output of wavelength, and then the white light can be generated and the various color temperatures can be modulated.

Figure 5:
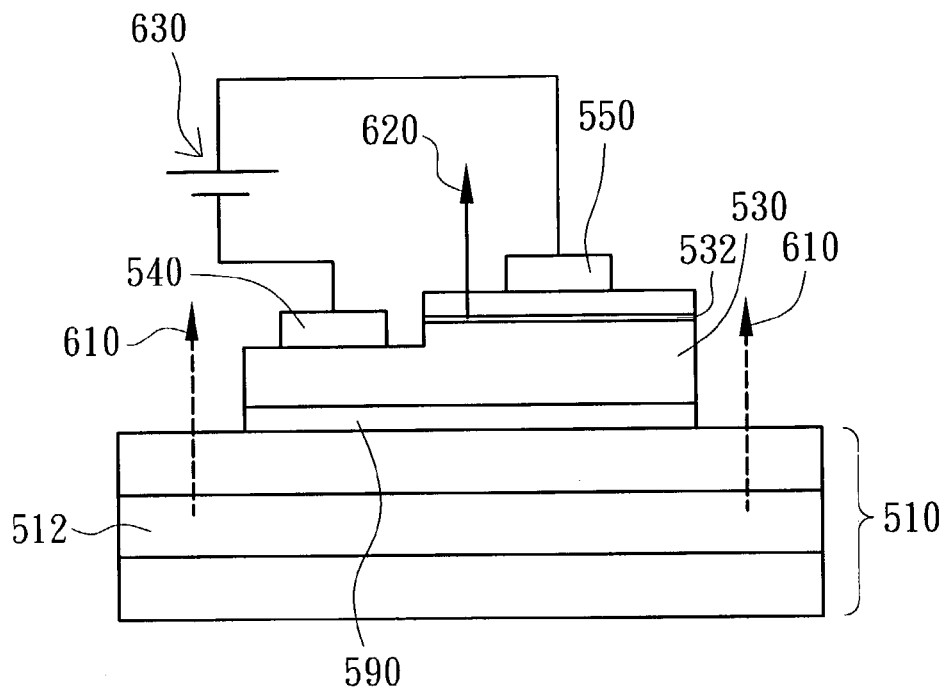
FIG. 5 is a diagram showing the front view of the color mixing LED according to still another embodiment of the present invention.

Please refer to FIG. 5 showing the front view of the color mixing LED according to still another embodiment of the present invention. The lowest layer shown in FIG. 5 is the LED having a red light to yellow light photoluminescence structure 510 further comprising the structure of multi quantum well 512. Therefore, the LED having the red light to yellow light photoluminescence structure 510 does not need the positive or negative electrode used to be connected to external power 630. That is, two electrodes of the external power 630 are electrically connected to a positive electrode 550 and a negative electrode 540 of an AlGaInBNAsP blue light LED 530 (having the light emitting layer 532) respectively. Consequently, the blue light 620 emitted by the AlGaInBNAsP blue light LED 530 can be used to excite the LED having the red light to yellow light photoluminescence structure 510, thereby making the LED having the red light to yellow light photoluminescence structure 510 to emit the red light to yellow light 610 and then making the red light to yellow light 610 to be mixed with the blue light 620 into the purple light to white light. In addition, the transparent adhesive layer 590 (such as transparent heat-conductive glue) is used to adhere the AlGaInBNAsP blue light LED 530 and the LED having the red light to yellow light photoluminescence structure 510. Furthermore, the electrodes shown in FIG. 5 can be replaced simultaneously with those having opposite polarity but still within the scope of the claims of the present invention.

Figure 6:
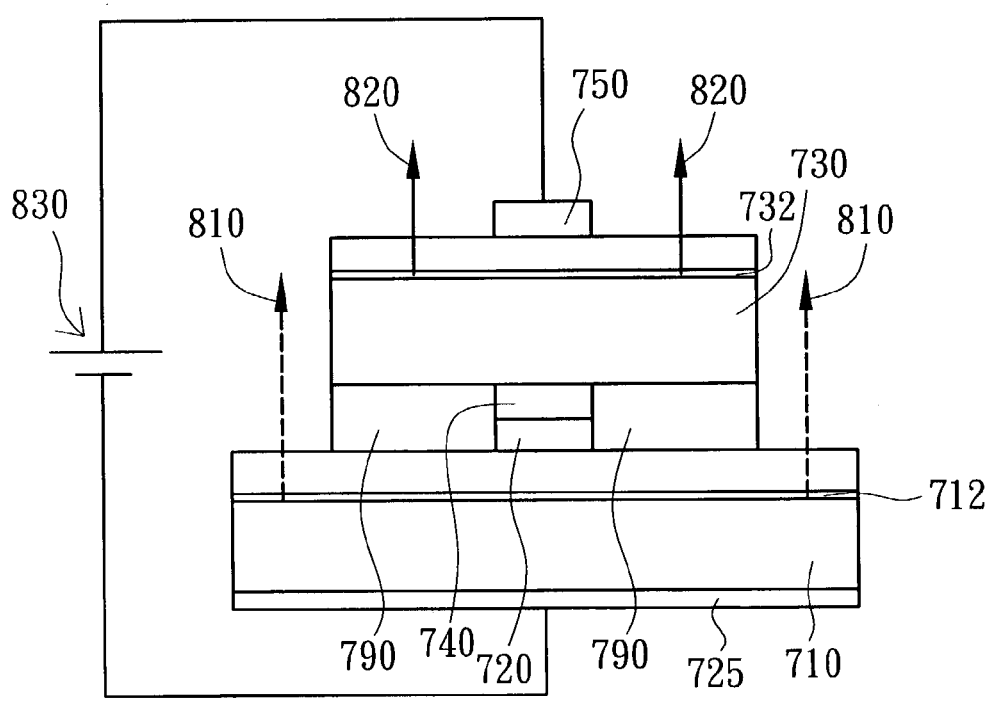
FIG. 6 is a diagram showing the front view of the color mixing LED according to further another embodiment of the present invention.

Please refer to FIG. 6 showing the front view of the color mixing LED according to further another embodiment of the present invention. As shown in FIG. 6, a negative electrode 725 is located on the lower surface of an AlGaInAsP yellow light LED 710 (having a light emitting layer 712); and a positive electrode 720 of the AlGaInAsP yellow light LED 710 is located on one portion of the surface of the AlGaInAsP yellow light LED 710. Besides, a negative electrode 740 of an AlGaInBNAsP blue light LED 730 (having a light emitting layer 732) is located on the positive electrode 720 and connects the positive electrode 720. Moreover, a transparent adhesive layer 790 (such as SiO$_2$ or heat-conductive glue) is located on the other portion of the AlGaInAsP yellow light LED 710; and the upper surface of the transparent adhesive layer 790 has about the same height as the upper surface of the negative electrode 740. Furthermore, two electrodes of power 830 are electrically connected to a positive electrode 750 of the AlGaInBNAsP blue light LED 730 and a negative electrode 725 of the AlGaInAsP yellow light LED 710. Therefore, the blue light 820 emitted by the AlGaInBNAsP blue light LED 730 can be mixed with the yellow light 810 emitted by the AlGaInAsP yellow light LED 710 into white light. In addition, the aforementioned AlGaInAsP yellow light LED 710 can be replaced with the LED chips of other types that can emit reddish-orange light; and the AlGaInBNAsP blue light LED 730 can be replaced with the LED chips of other types that can emit bluish-green light, thereby making the color mixing LED of the present invention to emit white light. Besides, the electrodes shown in FIG. 6 can be replaced simultaneously with those having opposite polarity but still within the scope of the claims of the present invention.

Figure 7:
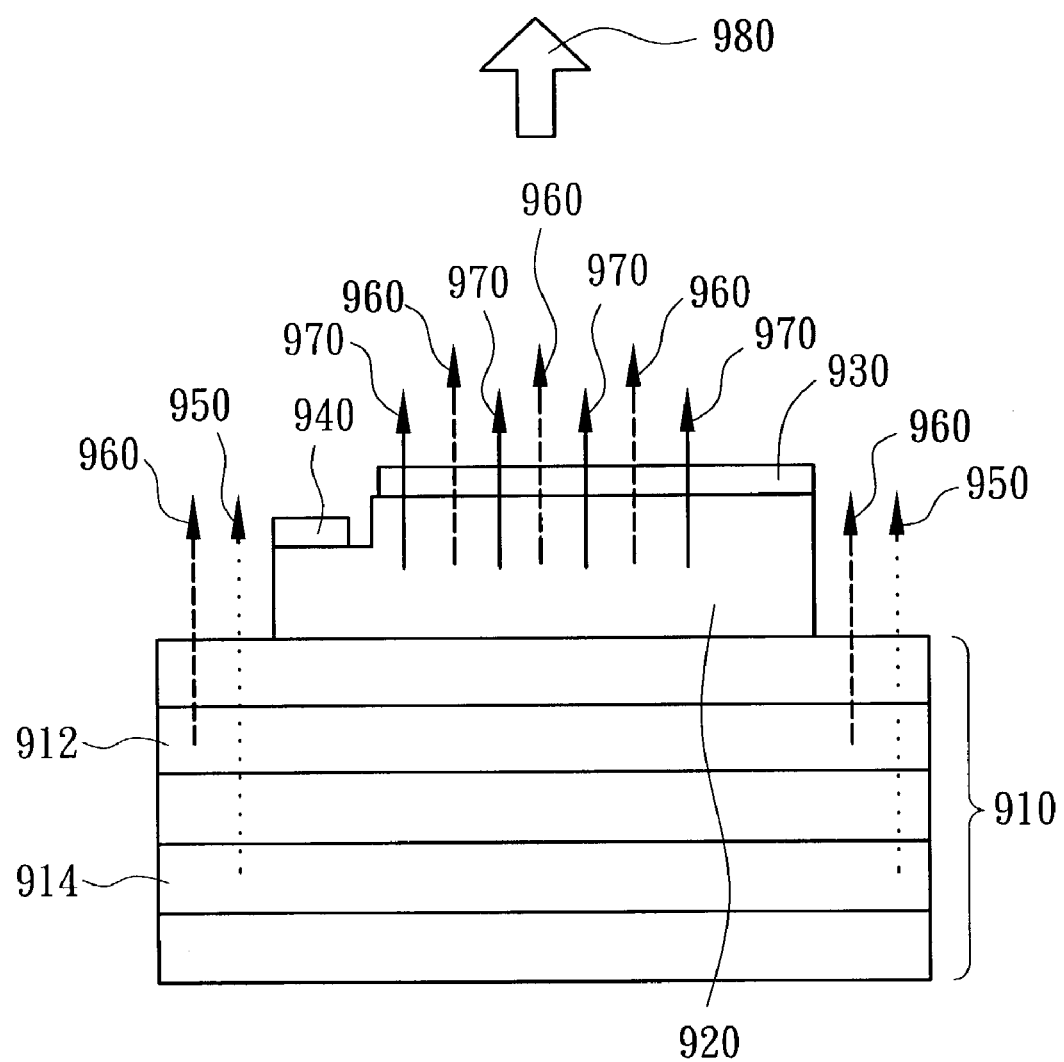
FIG. 7 is a diagram showing the front view of the color mixing LED according to even another embodiment of the present invention.

Please refer to FIG. 7 showing the front view of the color mixing LED according to even another embodiment of the present invention. The lowest layer shown in FIG. 7 is the LED having a photoluminescence structure 910 further comprising the structures of a yellow-green photoluminescence multi quantum well 912 and a red photoluminescence multi quantum well 914. Therefore, the LED having the photoluminescence structure 910 does not need the positive or negative electrode used to be connected to the external power (not shown). That is, two electrodes of the external power are electrically connected to a positive electrode 930 and a negative electrode 940 of a bluish-green light LED 920 respectively. Consequently, the blue light 970 emitted by the bluish-green light LED 920 can be used to excite the LED having the LED having the photoluminescence structure 910, thereby making the LED having the photoluminescence structure 910 to emit the red light 950 and the yellow-green light 960 and then making the red light 950 and the yellow-green light 960 to be mixed with the blue light 970 into the white light 980.

Figure 8A:
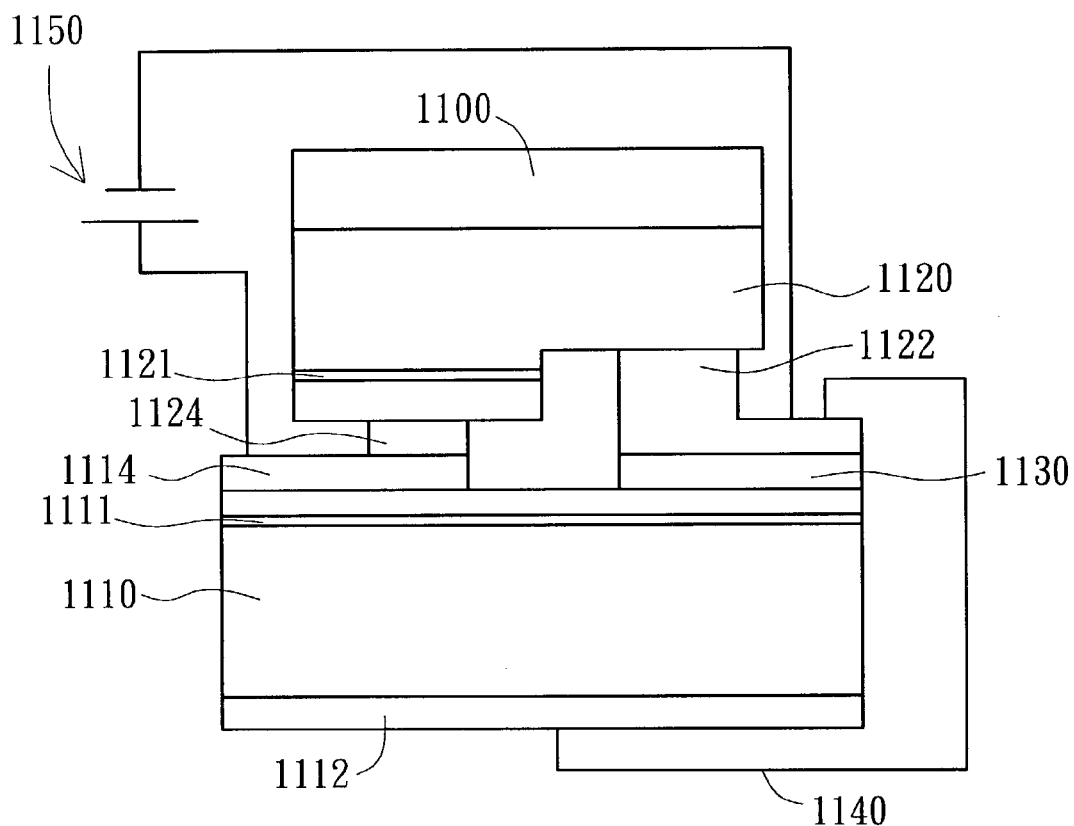
FIG. 8A is a diagram showing the front view of the color mixing LED according to another embodiment of the present invention.
Figure 8B:
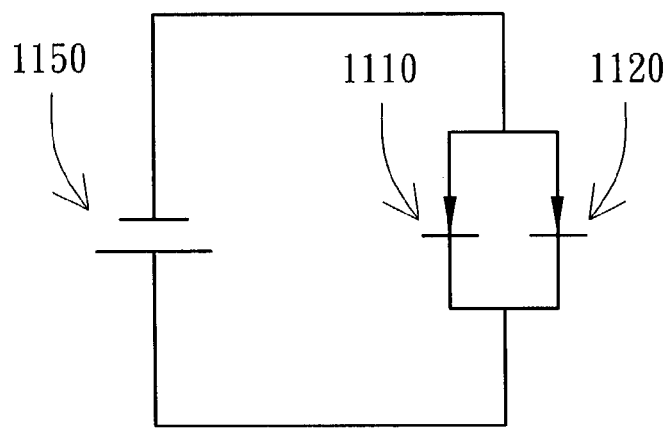
FIG. 8B is a diagram showing the equivalent circuit of the embodiment of the present invention shown in FIG. 8A.

Please refer to FIG. 8A showing the front view of the color mixing LED according to another embodiment of the present invention. As shown in FIG. 8A, a negative electrode 1112 is located on the lower surface of a yellow light LED 1110 (having a light emitting layer 1111); and a positive electrode 1114 of the yellow light LED 1110 is located on one portion of the surface of the yellow light LED 1110. An insulating layer 1130 (such as an oxidation layer) is located on the other portion of the surface of the yellow light LED 1110. As to a blue light LED 1120 (having a light emitting layer 1121), it has a substrate 1100 (an insulating substrate made of material such as sapphire) and a positive electrode 1124 and a negative electrode 1122, wherein the substrate 1100 is located on the blue light LED 1120; and the positive electrode 1124 and the negative electrode 1122 are located on the lower surface of the blue light LED 1120. Moreover, the negative electrode 1122 of the blue light LED 1120 is located on the insulating layer 1130; and the positive electrode 1124 of the blue light LED 1120 is electrically connected to the positive electrode 1114 of the yellow light LED 1110. Furthermore, a connective wire 1140 can be used to electrically connect the negative electrode 1112 of the yellow light LED 1110 and the negative electrode 1122 of the blue light LED 1120 to achieve the electrical connection between the yellow light LED 1110 and the blue light LED 1120 in parallel. In addition, two electrodes of power 1150 can be electrically connected to the positive electrode 1114 of the yellow light LED 1110 (or the positive electrode 1124 of the blue light LED 1120) and the negative electrode 1122 of the blue light LED 1120 (or the negative electrode 1112 of the yellow light LED 1110) respectively. Therefore, the blue light emitted by the blue light LED 1120 can be mixed with the yellow light emitted by the yellow light LED 1110 into white light. In addition, the aforementioned yellow light LED 1110 can be replaced with the LED chips of other types that can emit reddish-orange light; and the blue light LED 1120 can be replaced with the LED chips of other types that can emit bluish-green light, thereby making the color mixing LED of the present invention to emit white light. Besides, the electrodes shown in FIG. 8A can be replaced simultaneously with those having opposite polarity but still within the scope of the claims of the present invention. Further, FIG. 8B shows the equivalent circuit of the embodiment of the present invention shown in FIG. 8A.

Figure 9:
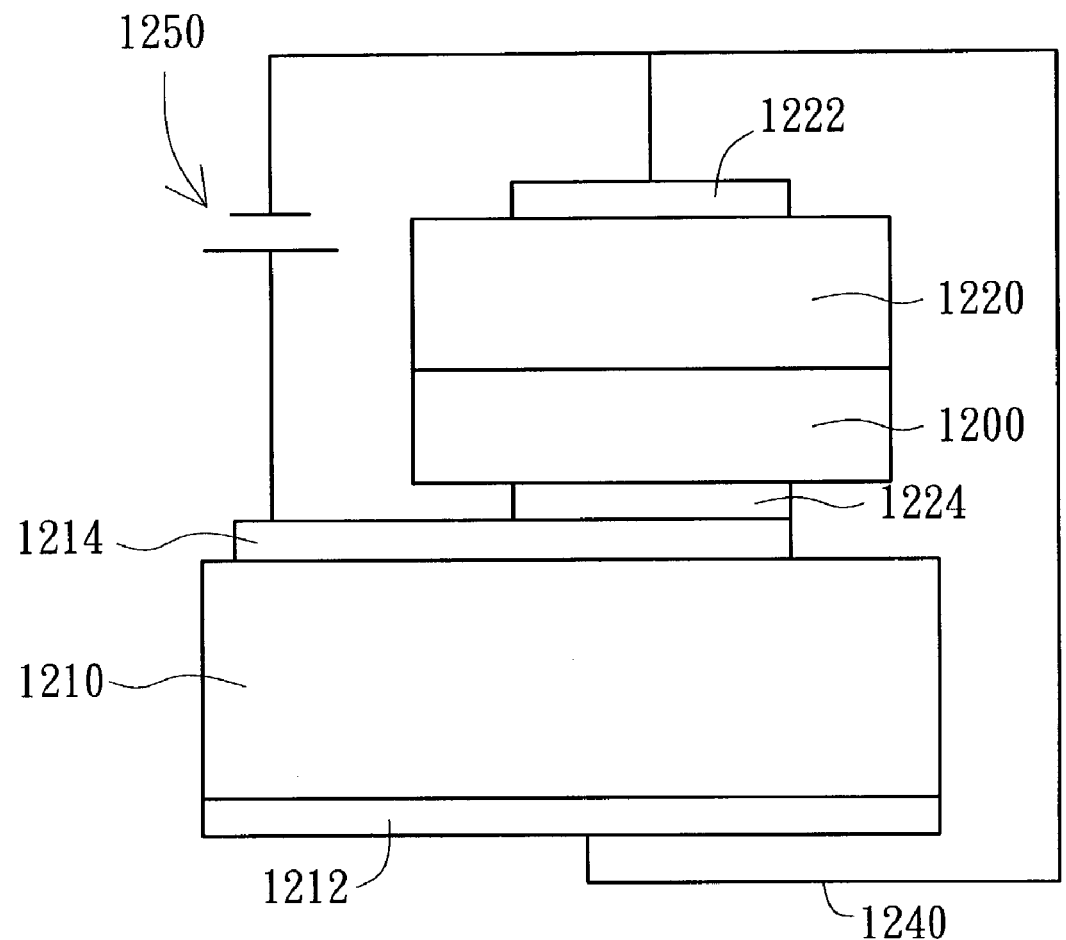
FIG. 9 is a diagram showing the front view of the color mixing LED according to still another embodiment of the present invention.

Please refer to FIG. 9 showing the front view of the color mixing LED according to still another embodiment of the present invention. As shown in FIG. 9, a negative electrode 1212 is located on the lower surface of a yellow light LED 1210 (made of material such as BAlGaInNPAs); and a positive electrode 1214 of the yellow light LED 1210 is located on the surface of the yellow light LED 1210. As to a blue light LED 1220 (made of material such as BAlGaIn-NPAs), it has a electrically conductive substrate 1200, the positive electrode 1224, and a negative electrode 1222, wherein the blue light LED 1220 is located on the electrically conductive substrate 1200; the negative electrode 1222 is located on the blue light LED 1220; and the positive electrode 1224 is located on the lower surface of the electrically conductive substrate 1200. Moreover, the positive electrode 1224 of the blue light LED 1220 is electrically connected to the positive electrode 1214 of the yellow light LED 1210. Furthermore, the connective wire 1240 can be used to electrically connect the negative electrode 1212 of the yellow light LED 1210 and the negative electrode 1222 of the blue light LED 1220 to achieve the electrical connection between the yellow light LED 1210 and the blue light LED 1220 in parallel. In addition, two electrodes of power 1250 can be electrically connected to the positive electrode 1214 of the yellow light LED 1210 (or the positive electrode 1224 of the blue light LED 1220) and the negative electrode 1222 of the blue light LED 1220 (or the negative electrode 1212 of the yellow light LED 1210) respectively. Therefore, the blue light emitted by the blue light LED 1220 can be mixed with the yellow light emitted by the yellow light LED 1210 into white light. In addition, the aforementioned yellow light LED 1210 can be replaced with the LED chips of other types that can emit reddish-orange light; and the blue light LED 1220 can be replaced with the LED chips of other types that can emit bluish-green light, thereby making the color mixing LED of the present invention to emit white light. Besides, the electrodes shown in FIG. 9 can be replaced simultaneously with those having opposite polarity but still within the scope of the claims of the present invention.

In the aforementioned embodiments shown in FIG. 8A and FIG. 9, the epitaxial structure of the reddish-orange (or yellow) light LED can be adjusted to increase internal impedance to raise the operating voltage, wherein when the operating current is 5 mA~50 mA, the operating voltage further can be raised to 2.3 V~3.2 V, thereby the epitaxial structure of the reddish-orange (or yellow) light LED can be flip-chip connected with the bluish-green (or blue) light LED in parallel to generate white light or light of other color.

Figure 10:
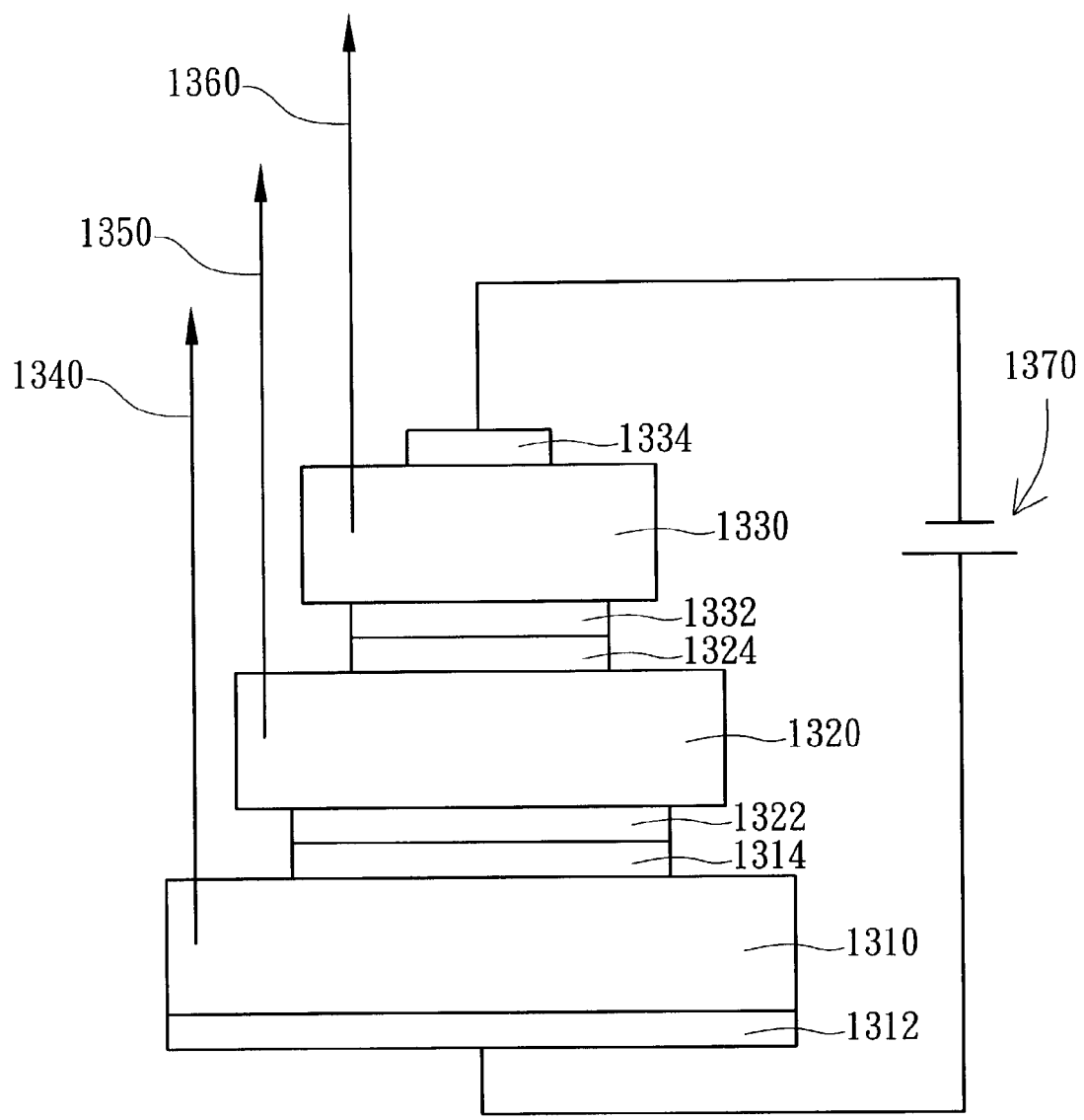
FIG. 10 is a diagram showing the front view of the color mixing. LED according to further another embodiment of the present invention.

Please refer to FIG. 10 showing the front view of the color mixing LED according to further another embodiment of the present invention. As shown in FIG. 10, the color mixing LED comprises a red-light LED chip 1310, a green-light LED chip 1320, and a blue light LED chip 1330. The red-light LED chip 1310 has a negative electrode 1312 thereunder and a positive electrode 1314 thereon; the green-light LED chip 1320 has a negative electrode 1322 thereunder and a positive electrode 1324 thereon; and the blue light LED chip 1330 has a negative electrode 1332 thereunder and a positive electrode 1334 thereon. The positive electrode 1314 and the negative electrode 1322 are electrically connected; and the positive electrode 1324 and the negative electrode 1332 are electrically connected so that the red-light LED chip 1310, the green-light LED chip 1320, and the blue light LED chip 1330 can be electrically connected in series. Besides, two electrodes of power 1370 can be electrically connected to the positive electrode 1334 of the blue light LED 1330 and the negative electrode 1312 of the red-light LED 1310 respectively. Therefore, the blue light 1360 emitted by the blue light LED 1330, the green light 1350 emitted by the green-light LED 1320, and the red light 1340 emitted by the red-light LED 1310 can be mixed into white light. In addition, the relative positional relation among the red-light LED chip 1310, the green-light LED chip 1320, and the blue light LED chip 1330 is not necessary to be limited to that as shown in FIG. 10; and can be changed arbitrarily but still within the scope of the claims of the present invention. For example, the blue light LED chip can be the lowest layer; the red-light LED chip can be the middle layer; and the green-light LED chip can be the top layer. Besides, the electrodes shown in FIG. 10 can be replaced simultaneously with those having opposite polarity but still within the scope of the claims of the present invention.

Figure 11:
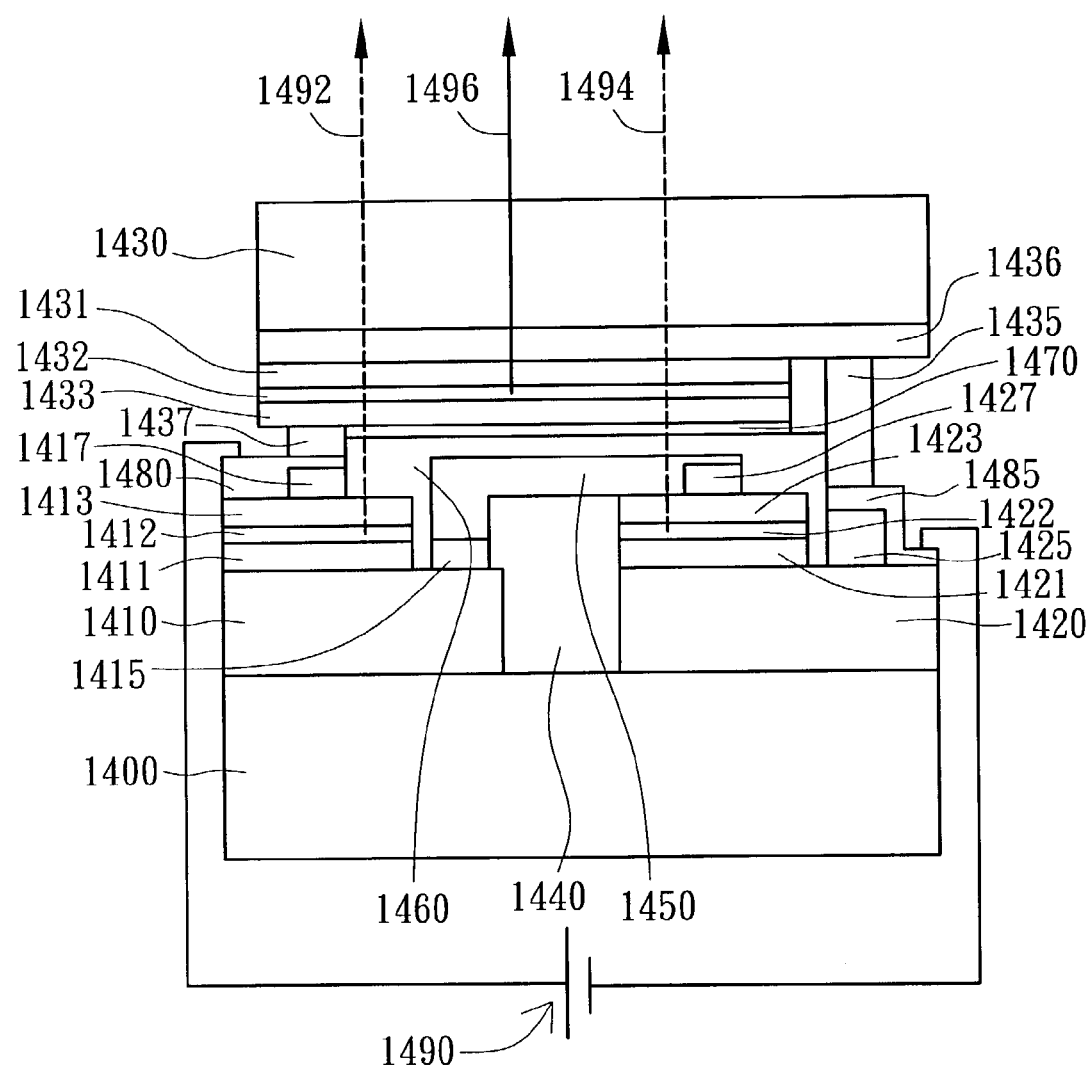
FIG. 11 is a diagram showing the front view of the color mixing LED according to another embodiment of the present invention.
Figure 12:
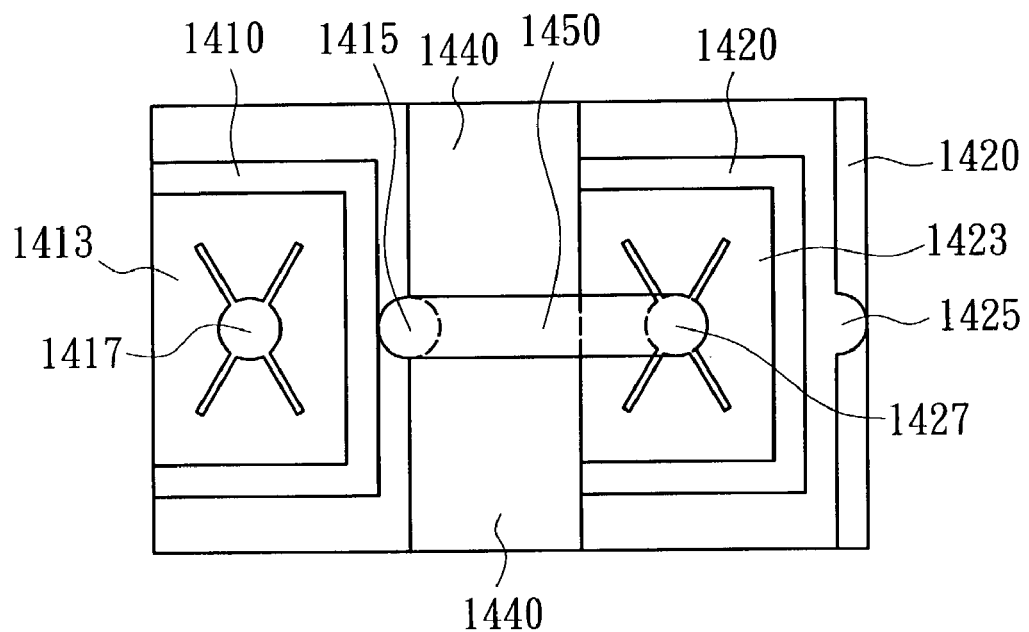
FIG. 12 is a diagram showing the top view of the two reddish-orange LEDs located below as shown in FIG. 11.
Figure 13:
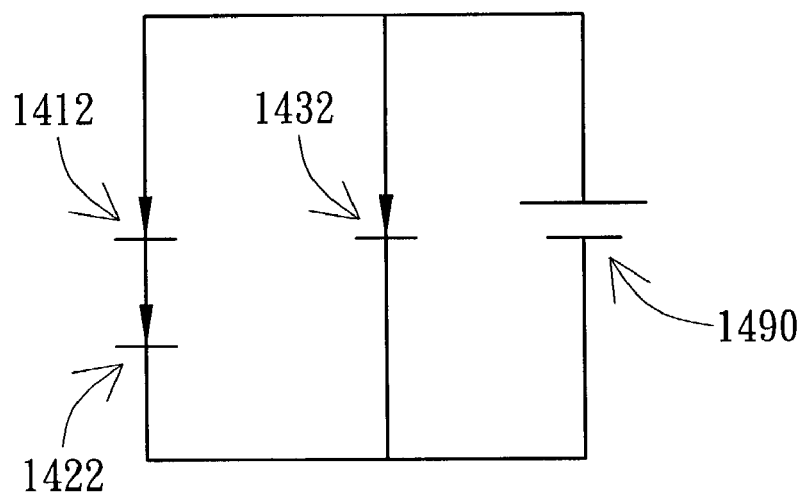
FIG. 13 is a diagram showing the equivalent circuit of the embodiment of the present invention shown in FIG. 11.

Please refer to FIG. 11 showing the front view of the color mixing LED according to another embodiment of the present invention. The color mixing LED (made of material such as BAlGaInNPAs) shown in FIG. 11 is composed of two BAlGaInNPAs reddish-orange LED chips and one BAlGaInNPAs bluish-green LED chip. The first reddish-orange LED chip comprises the stacked structure composed of a N type conductive layer 1410 located on an insulating semi-insulating substrate 1400 (such as semi-insulating GaAs), a N type confining layer 1411, a reddish-orange LED light emitting layer 1412, and a P type confining layer 1413, and a N type electrode 1415 and a P type electrode 1417, wherein the N type electrode 1415 and the P type electrode 1417 are located on a portion of the N type conductive layer 1410 and a portion of the P type confining layer 1413 respectively. The second reddish-orange LED chip comprises the stacked structure composed of a N type conductive layer 1420 located on the semi-insulating substrate 1400, a N type confining layer 1421, a reddish-orange LED light emitting layer 1422, and a P type confining layer 1423, and a N type electrode 1425 and a P type electrode 1427, wherein the N type electrode 1425 and the P type electrode 1427 are located on a portion of the N type conductive layer 1420 and a portion of the P type confining layer 1423 respectively. The bluish-green LED chip comprises the stacked structure composed of a transparent substrate 1430 (made of material such as sapphire), a N type conductive layer 1436, a N type confining layer 1431, a bluish-green LED light emitting layer 1432, a P type confining layer 1433, a N type electrode 1435 and a P type electrode 1437, wherein the N type electrode 1435 and the P type electrode 1437 are located on a portion of the N type conductive layer 1436 and a portion of the P type confining layer 1433 respectively. The aforementioned bluish-green LED chip can be adhered to the first reddish-orange LED chip and the second reddish-orange LED chip by flip-chip technique. Moreover, as shown in FIG. 11, the combined color mixing LED further comprises an insulating layer 1440, a metal layer 1450, an insulating layer 1460, a metal electrode 1480, a metal electrode 1485, and a transparent insulating glue 1470, etc. The insulating layer 1440, insulating layer 1460, and transparent insulating glue 1470 can be used to assure insulation among the three LED chips. The metal layer 1450 can be used to electrically connect the N type electrode 1415 and P type electrode 1427, thereby making the two reddish-orange LED chips electrically connected in series. The metal electrode 1480 connects electrically the P type electrode 1417 and P type electrode 1437; and the metal electrode 1485 connects electrically the N type electrode 1425 and N type electrode 1435, thereby making the two reddish-orange LED chips to further connect to the bluish-green LED chip in parallel after the two reddish-orange LED chips have been connected in series. In addition, the two electrodes of the power 1490 (of such as 3 V~4 V) can be connected to the metal electrode 1480 and the metal electrode 1485 respectively. Therefore, the bluish-green light 1496 emitted by the bluish-green light LED light emitting layer 1432 can be mixed with the reddish-orange light 1492 emitted by the reddish-orange light LED light emitting layer 1412 and the reddish-orange light 1494 emitted by the reddish-orange light LED light emitting layer 1422 to generate white light. Besides, the aforementioned two reddish-orange light LEDs can be replaced with the LED chips of other types that can emit yellow light; and the bluish-green light LED can be replaced with the LED chips of other types that can emit blue light, thereby also making the color mixing LED of the present invention to emit white light. Moreover, the electrodes shown in FIG. 11 can be replaced simultaneously with those having opposite polarity but still within the scope of the claims of the present invention. Furthermore, FIG. 12 shows the top view of the two reddish-orange LEDs located below as shown in FIG. 11; and FIG. 13 shows the equivalent circuit of the embodiment of the present invention shown in FIG. 11.

Figure 14:
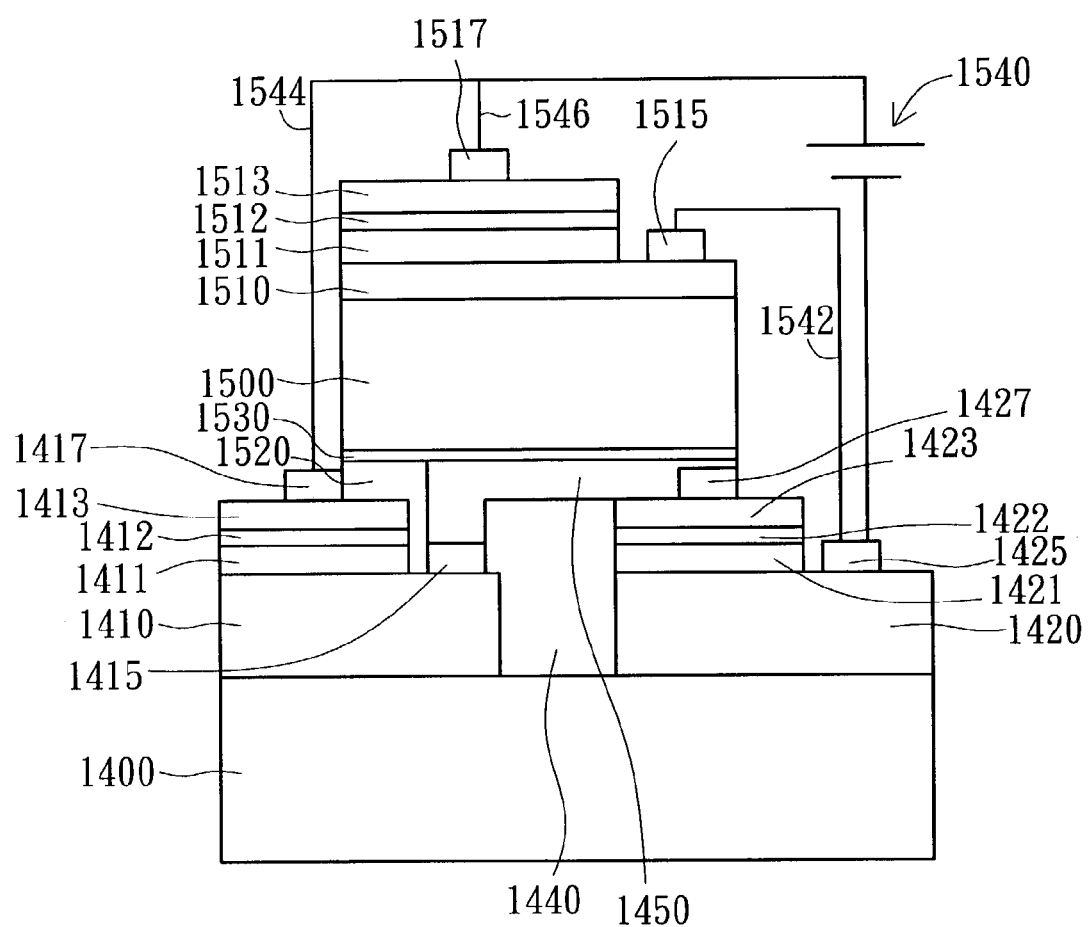
FIG. 14 is a diagram showing the front view of the color mixing LED according to still another embodiment of the present invention.

Please refer to FIG. 14 showing the front view of the color mixing LED according to still another embodiment of the present invention. The difference between those shown in FIG. 14 and FIG. 11 is that the bluish-green LED chip shown in FIG. 11 is adhered to the two reddish-orange LED chips by flip-chip technique; and the bluish-green LED chip shown in FIG. 14 is adhered to the two reddish-orange LED chips by transparent insulating glue 1530. The bluish-green LED chip shown in FIG. 14 comprises the stacked structure composed of an insulating substrate 1500, a N-type conductive layer 1510, a N type confining layer 1511, a bluish-green LED light emitting layer 1512, a P type confining layer 1513, a N type electrode 1515 and a P type electrode 1517, wherein the N type electrode 1515 and the P type electrode 1517 are located on a portion of the N-type conductive layer 1510 and a portion of the P-type conductive layer 1513 respectively. Besides, the insulating layer 1520 is used to assure insulation between the bluish-green LED chip and the first reddish-orange LED chip. In addition, the metal layer 1450 is used to electrically connect the N type electrode 1415 and the P type electrode 1427, thereby enabling the two reddish-orange LED chips connected electrically in series. The connective wire 1544 and the connective wire 1546 connect electrically the P type electrode 1417 and the P type electrode 1517; and the connective wire 1542 connects electrically the N type electrode 1425 and the N type electrode 1515, thereby enabling the two reddish-orange LED chips to further connect to the bluish-green LED chip in parallel after the two reddish-orange LED chips have been connected in series. Besides, the two electrodes of the power 1540 (of such as 3 V~4 V) can be electrically connected to the connective wire 1544 (or connective wire 1546) and N type electrode 1425 respectively. Therefore, the bluish-green light emitted by the bluish-green light LED light emitting layer 1512 can be mixed with the reddish-orange light emitted by the reddish-orange light LED light emitting layer 1412 and the reddish-orange light emitted by the reddish-orange light LED light emitting layer 1422 to generate white light. Moreover, the aforementioned two reddish-orange light LEDs can be replaced with the LED chips of other types that can emit yellow light; and the bluish-green light LED can be replaced with the LED chips of other types that can emit blue light, thereby also making the color mixing LED of the present invention to emit white light. Furthermore, the electrodes shown in FIG. 14 can be replaced simultaneously with those having opposite polarity but still within the scope of the claims of the present invention.

Figure 15:
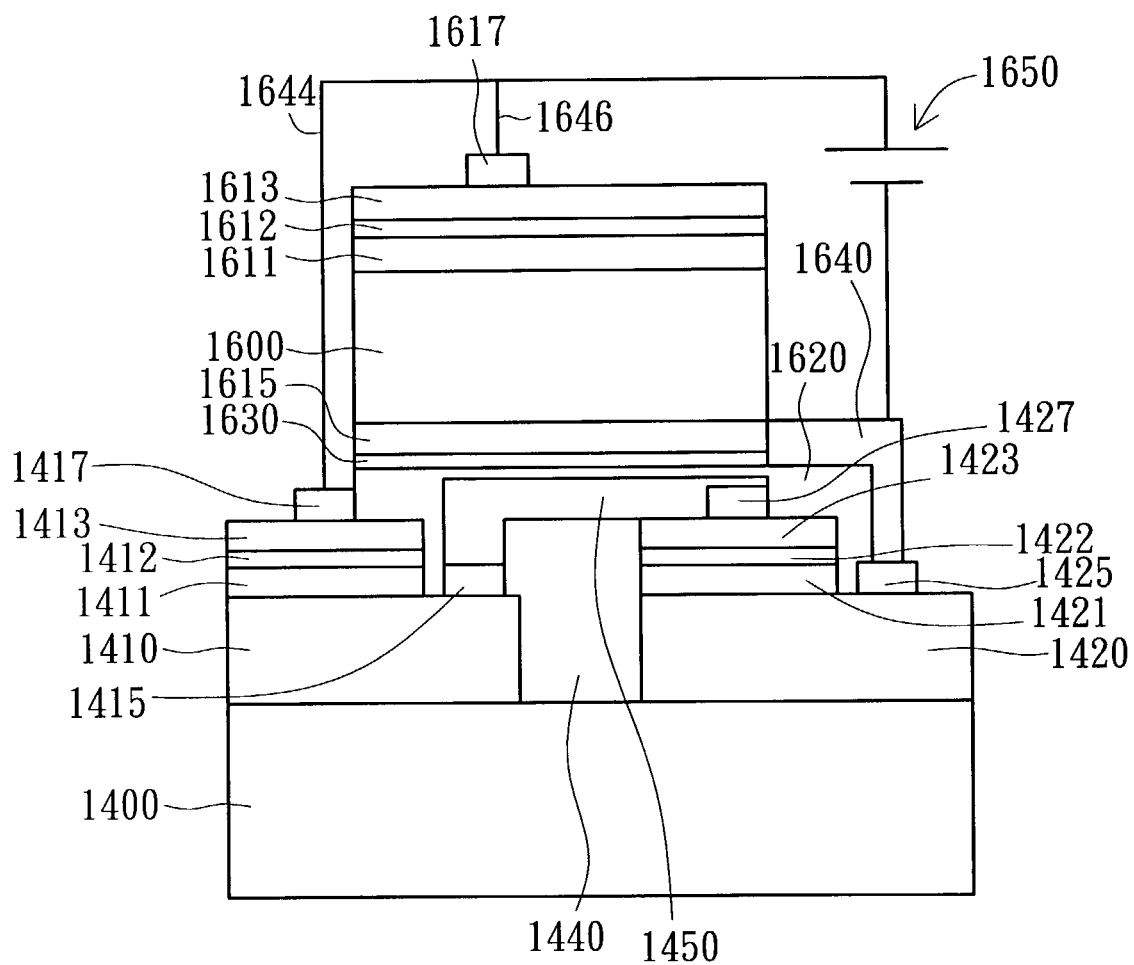
FIG. 15 is a diagram showing the front view of the color mixing LED according to further another embodiment of the present invention.

Please refer to FIG. 15 showing the front view of the color mixing LED according to further another embodiment of the present invention. The difference between those shown in FIG. 15 and FIG. 14 is that the substrate 1500 of the bluish-green light LED chip shown in FIG. 14 is made of insulating material, hence its N type electrode 1515 and P type electrode 1517 are located on the same side of the substrate 1500; and the bluish-green light LED chip shown in FIG. 15 has a conductive substrate 1600, hence its N type electrode 1615 and P type electrode 1617 are located on the different sides of the conductive substrate 1600 (made of material such as SiC). The bluish-green LED chip shown in FIG. 15 comprises the stacked structure composed of a conductive substrate 1600, a N type confining layer 1611, a bluish-green light LED light emitting layer 1612, a P type confining layer 1613, a N type electrode 1615 and a P type electrode 1617, wherein the N type electrode 1615 and the P type electrode 1617 are located on the lower surface of the conductive substrate 1600 and that of the P type confining layer 1613 respectively. In addition, an insulating layer 1620 is used to assure insulation between the bluish-green light LED chip and the two reddish-orange light LED chips; and transparent insulating glue 1630 is used to adhere the bluish-green light LED chip and the two reddish-orange light LED chips. Besides, the metal layer 1450 is used to connect electrically the N type electrode 1415 and P type electrode 1427, enabling the two reddish-orange LED chips connected electrically in series. The connective wire 1644 and connective wire 1646 connect electrically the P type electrode 1417 and P type electrode 1617; and the metal layer 1640 connects electrically the N type electrode 1425 and N type electrode 1615, thereby enabling the two reddish-orange LED chips to further connect to the bluish-green LED chip in parallel after the two reddish-orange LED chips have been connected in series. Besides, the two electrodes of the power 1650 (of such as 3 V~4 V) can be electrically connected to the connective wire 1644 (or connective wire 1646) and metal layer 1640 respectively. Therefore, the bluish-green light emitted by the bluish-green light LED light emitting layer 1612 can be mixed with the reddish-orange light emitted by the reddish-orange light LED light emitting layer 1412 and the reddish-orange light emitted by the reddish-orange light LED light emitting layer 1422 to generate white light. Moreover, the aforementioned two reddish-orange light LEDs can be replaced with the LED chips of other types that can emit yellow light; and the bluish-green light LED can be replaced with the LED chips of other types that can emit blue light, thereby also making the color mixing LED of the present invention to emit white light. Furthermore, the electrodes shown in FIG. 15 can be replaced simultaneously with those having opposite polarity but still within the scope of the claims of the present invention.

Generally speaking, when the operating current of the reddish-orange light LED is 5 mA~50 mA, the operating voltage is about 1.6 V~2 V. Consequently, if two reddish-orange light LEDs are connected in series, the operating voltage is about 3.2 V~4 V. Afterwards, if the two reddish-orange light LEDs are further connected to a bluish-green light LED (having operating voltage of 3 V~4 V) in parallel, then this color mixing LED made of the three LEDs can be suitable for application of mobile phones or digital cameras, etc. using power of 3 V~4 V, thereby generating white light or pink light, etc.

To sum up, an advantage of the present invention is to provide a color mixing LED, wherein a plurality of LEDs having different wavelengths are electrically connected in series or in parallel, wherein the epitaxy structure is changed to generate very large range of light-emitting wavelengths; and the shape of electrode pads and the size of chip of the plurality of LEDs are changed to generate different current spreading and different light output power ratio, thereby creating the luminance output of high power having very large range of light-emitting wavelengths and extensive and stable range of color temperature.

Another advantage of the present invention is to provide a color mixing LED, wherein the constant current or constant voltage is used to generate stable output so that the light-emitting wavelength will not change easily as the temperature and the operating current change.

Still another advantage of the present invention is to provide a color mixing LED, wherein each module can be used in current application products of 12 V or 24 V easily since its operating voltage is such as 6 V (with blue light of 3–4 V and yellow light of 2–2.5 V).

Further still another advantage of the present invention is to provide a color mixing LED, wherein the brightness of each LED can be controlled by modulating the size of the relative area of each LED, thereby achieving the purpose of controlling output wavelength easily.

Even still another advantage of the present invention is to provide a color mixing LED, wherein the mixed light that is emitted by the adhered plurality of LEDs has symmetry.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

What is claimed is:

1. A color mixing light emitting diode (LED), comprising:
a first electrode having a first polarity;
a first LED chip located on the first electrode, and the first LED chip emits yellow light or reddish-orange light;
a second LED chip located on one portion of the first LED chip, and the second LED chip emits blue light or bluish-green light, wherein while the first LED chip emits yellow light, the second LED chip emits blue light, and while the first LED chip emits reddish-orange light, and the second LED chip emits bluish-green light;
a second electrode having a second polarity, wherein the second electrode is located on the other portion of the first LED chip;
a third electrode having the first polarity, wherein the third electrode is located on one portion of the second LED chip, and the third electrode and the second electrode are electrically connected via a connective wire; and
a fourth electrode having the second polarity, wherein the fourth electrode is located on the other portion of the second LED chip, and the first electrode and the fourth electrode are electrically to a power to form a single circuit in series.

2. A color mixing LED, comprising:
a first LED chip, and the first LED chip emits yellow light or reddish-orange light;
a transparent adhesive layer located on a first portion of the first LED chip;
a first electrode having a first polarity, wherein the first electrode is located on a second portion of the first LED chip;
a second electrode having a second polarity, wherein the second electrode is located on a third portion of the first LED chip; and
a second LED chip located on the transparent adhesive layer, and the second LED chip emits blue light or bluish-green light, wherein while the first LED chip emits yellow light, the second LED chip emits blue light, and while the first LED chip emits reddish-orange light, and the second LED chip emits bluish-green light;
a third electrode having the first polarity is located on a portion of a lower surface of the second LED chip, and the third electrode contacts the second electrode; and
a fourth electrode having the second polarity is located on the other portion of the lower surface of the second LED chip, and the fourth electrode contacts the first electrode.

3. A color mixing LED, comprising:
a first electrode having a first polarity;
a first LED chip located on the first electrode, and the first LED chip emits yellow light or reddish-orange light;
a second electrode having a second polarity, wherein the second electrode is located on one portion of the first LED chip;
a third electrode having the first polarity, wherein the third electrode is located on the second electrode and contacts the second electrode;
a transparent adhesive layer located on the other portion of the first LED chip, wherein the transparent adhesive layer has about the same height as the third electrode;
a second LED chip located on the transparent adhesive layer and the third electrode, and the second LED chip emits blue light or bluish-green light, wherein while the first LED chip emits yellow light, the second LED chip emits blue light, and while the first LED chip emits reddish-orange light, and the second LED chip emits bluish-green light; and
a fourth electrode having the second polarity, wherein the fourth electrode is located on the second LED chip, and the first electrode and the fourth electrode are connected to a power.

4. A color mixing LED, comprising:
a first electrode having a first polarity;
a first LED chip located on the first electrode, wherein the first LED chip emits yellow light or reddish-orange light;
a second electrode having a second polarity, wherein the second electrode having the second polarity is located on one portion of the first LED chip;
a third electrode having the second polarity, wherein the third electrode having the second polarity is located on the second electrode having the second polarity;
an insulating layer located on the other portion of the first LED chip;
a fourth electrode having the first polarity, wherein the fourth electrode having the first polarity is located on the insulating layer, and the fourth electrode and the second electrode are connected to a power;
a second LED chip located on the third electrode having the second polarity and the fourth electrode having the first polarity, wherein an electrical connection between the first LED chip and the second LED chip is in parallel, and the second LED chip emits blue light or bluish-green light, wherein while the first LED chip emits yellow light, the second LED chip emits blue light, and while the first LED chip emits reddish-orange light, and the second LED chip emits bluish-green light; and
a substrate located on the second LED chip.

5. A color mixing LED, comprising:
a first electrode having a first polarity;
a first LED chip located on the first electrode, wherein the first LED chip emits yellow light or reddish-orange light;
a second electrode having a second polarity, wherein the second electrode having the second polarity is located on the first LED chip;
a third electrode having the second polarity, wherein the third electrode having the second polarity is located on the second electrode having the second polarity;
an electrically conductive substrate located on the third electrode having the second polarity;
a second LED chip located on the electrically conductive substrate, wherein an electrical connection between the first LED chip and the second LED chip is in parallel, and the second LED chip emits blue light or bluish-green light, wherein while the first LED chip emits yellow light, the second LED chip emits blue light, and while the first LED chip emits reddish-orange light, and the second LED chip emits bluish-green light; and
a fourth electrode having the first polarity, wherein the fourth electrode having the first polarity is located on the second LED chip, and the fourth electrode and the second electrode are connected to a power.

6. A color mixing LED, comprising:
a first LED chip having a first electrode and a second electrode, wherein the first electrode has a first polarity, and the second electrode has a second polarity;
a second LED chip having a third electrode and a fourth electrode, wherein the third electrode has the first polarity, and the fourth electrode has the second polarity, and the third electrode is electrically connected to the second electrode, and the first LED chip and the second LED chip emit yellow light or reddish-orange light; and
a third LED chip having a fifth electrode and a sixth electrode, wherein the fifth electrode has the first polarity, and the sixth electrode has the second polarity, and the fifth electrode is electrically connected to the first electrode, and the sixth electrode is electrically connected to the fourth electrode, and the first LED chip is electrically connected to the second LED chip in series, and the first LED chip and the second LED chip are electrically connected to the third LED chip in parallel, and the third LED chip emits blue light or bluish-green light, wherein while the first LED chip and the second LED chip emit yellow light, the third LED chip emits blue light, and while the first LED chip and the second LED chip emit reddish-orange light, and the third LED chip emits bluish-green light.

* * * * *

UNITED STATES PATENT AND TRADEMARK OFFICE
CERTIFICATE OF CORRECTION

PATENT NO.         : 7,064,354 B2
APPLICATION NO. : 10/408614
DATED              : June 20, 2006
INVENTOR(S)        : Shi-Ming Cheng It is certified that error appears in the above-identified patent and that said Letters Patent is hereby corrected as shown below:

Column 14, Line 51, Claim 1, "electrically to a power" should read
-- electrically connected to a power --

Signed and Sealed this

Seventh Day of November, 2006

JON W. DUDAS
*Director of the United States Patent and Trademark Office*